(12) United States Patent
Cho et al.

(10) Patent No.: US 8,040,719 B2
(45) Date of Patent: Oct. 18, 2011

(54) NONVOLATILE MEMORY DEVICES HAVING BIT LINE DISCHARGE CONTROL CIRCUITS THEREIN THAT PROVIDE EQUIVALENT BIT LINE DISCHARGE CONTROL

(75) Inventors: Beak-hyung Cho, Gyeonggi-do (KR); Yong-seok Jeon, Gyeonggi-do (KR); Hye-jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 415 days.

(21) Appl. No.: 12/323,583

(22) Filed: Nov. 26, 2008

(65) Prior Publication Data

US 2010/0128516 A1    May 27, 2010

(51) Int. Cl.
*G11C 11/00* (2006.01)
(52) U.S. Cl. ........................... 365/163; 365/148
(58) Field of Classification Search ............... 365/163, 365/148, 204
See application file for complete search history.

(56) References Cited

U.S. PATENT DOCUMENTS

| | | |
|---|---|---|
| 6,480,438 B1 | 11/2002 | Park |
| 6,487,113 B1 | 11/2002 | Park et al. |
| 6,791,867 B2 | 9/2004 | Tran |
| 7,215,592 B2 | 5/2007 | Cho et al. |
| 7,227,776 B2 * | 6/2007 | Cho et al. ............... 365/163 |
| 7,242,605 B2 | 7/2007 | Choi et al. |
| 7,391,669 B2 | 6/2008 | Kim et al. |
| 7,397,681 B2 * | 7/2008 | Cho et al. ............... 365/46 |
| 2003/0043620 A1 * | 3/2003 | Ooishi ................ 365/171 |
| 2004/0081004 A1 * | 4/2004 | Okazawa ............. 365/200 |
| 2004/0246808 A1 | 12/2004 | Cho et al. |
| 2005/0030814 A1 | 2/2005 | Oh et al. |
| 2005/0270883 A1 | 12/2005 | Cho et al. |

OTHER PUBLICATIONS

Cho et al., "A 0.18 μm 3.0V 64Mb Non-Volatile Phase-Transition Random-Access Memory (PRAM)," Paper 2.1, ISSCC 2004, Session 2, 2004 IEEE International Solid-State Circuits Conference, Feb. 16, 2004, pp. 1-2.

* cited by examiner

*Primary Examiner* — Vu Le
(74) *Attorney, Agent, or Firm* — Myers Bigel Sibley & Sajovec, P.A.

(57) ABSTRACT

A memory device includes a memory array having a plurality of rows and columns of nonvolatile memory cells (e.g., PRAM cells) therein and a first plurality of local bit lines electrically coupled to a corresponding first plurality of columns of memory cells in the memory array. A first plurality of bit line selection circuits are also provided, which are responsive to bit line selection signals. A first plurality of bit line discharge circuits are electrically connected to respective ones of the first plurality of local bit lines. A bit line discharge control circuit is provided to drive the first plurality of bit line discharge circuits with equivalent bit line discharge signals during an operation to read data from a selected one of the first plurality of local bit lines.

13 Claims, 10 Drawing Sheets

US 8,040,719 B2

NONVOLATILE MEMORY DEVICES HAVING BIT LINE DISCHARGE CONTROL CIRCUITS THEREIN THAT PROVIDE EQUIVALENT BIT LINE DISCHARGE CONTROL

CROSS-REFERENCE TO RELATED APPLICATIONS

This application is related to U.S. patent application Ser. No. 11/348,432, filed Feb. 6, 2006, now U.S. Pat. No. 7,397,681; U.S. patent application Ser. No. 11/316,878, filed Dec. 27, 2005, now U.S. Pat. No. 7,391,669; U.S. patent application Ser. No. 10/937,943, filed Sep. 11, 2004, now U.S. Pat. No. 7,242,605; U.S. patent application Ser. No. 11/035,205, filed Jan. 12, 2005, now U.S. Pat. No. 7,215,592; and U.S. patent application Ser. No. 11/315,130, filed Dec. 23, 2005, now U.S. Pat. No. 7,227,776, the disclosures of which are hereby incorporated herein by reference.

FIELD OF THE INVENTION

The present invention relates to integrated circuit devices and, more particularly, to integrated circuit memory devices.

BACKGROUND OF THE INVENTION

One class of nonvolatile memory devices includes phase-changeable random access memory (PRAM) devices, which offer many advantageous electrical characteristics relative to FLASH, SRAM and DRAM memory devices. PRAM devices support non-volatile data storage, random access addressing and relatively high speed read and write operations. PRAM devices may also be configured to have relatively low power consumption requirements.

The nonvolatile characteristics of the PRAM devices may be provided by configuring each memory cell with a chalcogenide alloy (e.g., GST: $Ge_2Sb_2Te_5$) having programmable resistivity characteristics. For example, during a write/programming operation, the chalcogenide alloy within a memory cell may undergo resistive heating to thereby alter the resistivity of the chalcogenide alloy and cause the memory cell to be "set" into one logic state or "reset" into another logic state.

FIG. 1 illustrates a conventional diode-type PRAM cell 10, which is electrically coupled to respective bit and word lines (BL and WL). In this PRAM cell 10, the chalcogenide alloy (e.g., GST alloy) may be programmed to have a relatively high resistance state (high-R state) or a relatively low resistance state (low-R state). This state may be detected during a reading operation by biasing the bit line BL at a higher voltage relative to the word line to thereby establish a forward current path through the PRAM cell 10. The magnitude of the established current (e.g., bit line current) in the forward current path is measured to determine the state (high-R or low-R) of the cell 10.

FIG. 2 illustrates a conventional memory device 200 having a plurality of PRAM memory blocks 210a-210n therein that are electrically coupled to a column decoder/driver circuit 220. Each of these PRAM memory blocks 210a-210n is illustrated as including a plurality of memory cell blocks (CBLK), word line drivers (WD), row decoders (XDEC) and local bit line selection circuits (YD) therein. Each memory cell block (CBLK) includes a two-dimensional array of PRAM cells 10 (C) spanning multiple columns and rows. Each row within the cell block (CBLK) is associated with a corresponding local word line (WL) and each column is associated with a corresponding local bit line (BL). The word lines are driven by a word line driver (WDC), which is shown as an inverter having an output electrically coupled to one end of a local word line (WL). The local bit lines (BL) are electrically coupled to a bit line selection circuit (BDC), which is shown as an NMOS transistor having a gate terminal responsive to a column selection signal Yi and a source terminal electrically coupled to a corresponding global bit line (GBL). The global bit lines (GBL) are controlled by the column decoder/driver circuit 220, containing a column decoder (YDEC), sense amplifier (SA) and write driver (WRITED) therein. Because the size of each memory cell block (CBLK) is a function of the drive characteristics of each word line driver (WD) and bit line selection circuit (YD), the resistance of each local word line (RWL) and the resistance of each local bit line (RBL) may indirectly influence the capacity of the memory device 200 for a given layout area.

To improve PRAM device performance, some techniques have been developed to reduce local word line resistance. One such technique is disclosed in U.S. Patent Publication No. 2005/0270883 to Cho et al., entitled "Memory Device with Reduced Word Line Resistance". As illustrated by FIG. 4 of Cho et al., a relatively long global word line may be replaced by a plurality of shorter local word lines (e.g., LWL0, LWL1 and LWL2) that are connected to respective pull-down switching devices (e.g., NMOS transistors N101, N102, N103, . . . , N106). These pull-down switching devices have gate terminals responsive to global word line signals (e.g., SWL0, SWL1 and SWL2). An additional technique is disclosed in U.S. Pat. No. 6,480,438 to Park, entitled "Providing Equal Cell Programming Conditions Across a Large and High Density Array of Phase-Change Memory Cells." In the '438 patent, bit line and word line compensation circuits are used to minimize resistance variations across the cells of an array to thereby provide equivalent cell programming conditions. Additional PRAM devices are disclosed in an article by W. Y. Cho et al., entitled "A 0.18 um 3.0V 64 Mb Non-Volatile Phase-Transition Random-Access Memory (PRAM)", Digest of the IEEE International Solid-State Circuits Conference, Session 2, Paper 2.1, pp. 1-2, Feb. 16, 2004. U.S. Pat. No. 6,791,867 to Tran, entitled "Selection of Memory Cells in Data Storage Devices", discloses a non-volatile memory device having memory cells therein with programmable resistance states and shunt elements connected in series within controlled current paths. Additional PRAM devices are disclosed in: U.S. Patent Publication No. 2005/0030814 to Oh et al., entitled "Data Read Circuit for Use in a Semiconductor Memory and Method Thereof", U.S. Patent Publication No. 2004/0246808 to Cho et al., entitled "Writing Driver Circuit of Phase-Change Memory" and U.S. Pat. No. 6,487,113 to Park et al., entitled "Programming a Phase-Change Memory with Slow Quench Time".

SUMMARY OF THE INVENTION

Embodiments of the present invention include phase-changeable random access memory (PRAM) devices having enhanced bit line and/or word line driving capability that supports high bit line and/or word line slew rates during programming and reading operations. These embodiments include a PRAM memory array having a plurality of rows and columns of PRAM memory cells therein and at least one local bit line electrically coupled to a column of PRAM memory cells in the PRAM memory array. First and second bit line selection circuits are also provided to increase the rate at which the at least one local bit line can be accessed and driven with a bit line signal. These first and second bit line selection circuits are configured to electrically connect first and second ends of the local bit line to a global bit line during an operation to read data from a selected one of the PRAM memory cells in the column. The first and second bit line selection circuits are further configured to electrically connect the first and second ends of the local bit line to the global bit line during an operation to write data to a selected one of the PRAM memory cells in the column. The first and second bit line selection circuits are responsive to equivalent column selection signals.

Still further embodiments of the present invention include a phase-changeable random access memory (PRAM) device having at least one local word line electrically coupled to a row of PRAM memory cells in a PRAM memory array and first and second word line driver circuits. The first and second word line driver circuits are electrically connected to first and second spaced-apart nodes on the local word line, respectively. The first and second word line driver circuits are configured to drive the first and second spaced-apart nodes at the same voltage level during an operation to read data from a selected one of the PRAM memory cells in the row. In some of these embodiments, the first and second word line driver circuits are electrically connected to a global word line. In additional embodiments of the invention, the local word line spans multiple PRAM memory arrays and the first and second spaced-apart nodes are located at intermediate points along the local word line.

Still further embodiments of the present invention include a phase-changeable random access memory (PRAM) device having a PRAM memory array of diode-controlled PRAM memory cells therein. At least one local word line and at least one local bit line are provided in the array. The at least one local word line is electrically coupled to a row of diode-controlled PRAM memory cells in the PRAM memory array and the at least one local bit line is electrically coupled to a column of diode-controlled PRAM memory cells in the PRAM memory array. First and second bit line selection circuits are provided, which are configured to electrically connect first and second ends of the local bit line to a global bit line during an operation to read data from a selected one of the diode-controlled PRAM memory cells in the column. First and second word line driver circuits are also provided, which are electrically connected to first and second spaced-apart nodes on the local word line, respectively. These first and second word line driver circuits are configured to drive the first and second spaced-apart nodes at the same voltage level during an operation to read data from a selected one of the diode-controlled PRAM memory cells in the row. The first and second bit line selection circuits are further configured to electrically connect the first and second ends of the local bit line to the global bit line during an operation to write data to a selected one of the PRAM memory cells in the column. The first and second bit line selection circuits are responsive to equivalent column selection signals. The first and second spaced-apart nodes may be located at opposing ends of the local word line. Alternatively, when the local word line spans multiple PRAM memory arrays, the first and second spaced-apart nodes may be located at intermediate points along the local word line.

According to yet another embodiment of the present invention, an integrated circuit memory device includes a bit line discharge control circuit configured to drive a plurality of bit line discharge circuits with equivalent signals. In particular, the memory device includes a memory array having a plurality of rows and columns of memory cells therein and a first plurality of local bit lines. The first plurality of local bit lines are electrically coupled to a corresponding first plurality of columns of memory cells in the memory array. A first plurality of bit line selection circuits are also provided, which are electrically coupled to the first plurality of local bit lines. The first plurality of bit line selection circuits are responsive to signals generated by a bit line discharge control circuit. In particular, the bit line discharge control circuit is configured to drive the first plurality of bit line discharge circuits with equivalent bit line discharge signals during an operation to read (and write) data from a selected one of the plurality of local bit lines.

According to some of these embodiments, the first plurality of bit line discharge circuits include a corresponding plurality of NMOS pull-down transistors having drain terminals electrically connected to respective ones of the first plurality of local bit lines. The bit line discharge control circuit is also configured to drive the gate terminals of the first plurality of NMOS pull-down transistors at an equivalent voltage during the operation to read data from the selected one of the first plurality of local bit lines.

According to still further embodiments of the present invention, a memory device is provided, which includes a memory array having a plurality of rows and columns of nonvolatile memory cells (e.g., PRAM cells) therein and a first plurality of local bit lines electrically coupled to a corresponding first plurality of columns of memory cells in the memory array. A first plurality of bit line selection circuits are also provided, which are responsive to bit line selection signals. A first plurality of bit line discharge circuits are electrically connected to respective ones of the first plurality of local bit lines. A bit line discharge control circuit is provided to drive the first plurality of bit line discharge circuits with equivalent bit line discharge signals during an operation to read data from a selected one of the first plurality of local bit lines

DETAILED DESCRIPTION OF PREFERRED EMBODIMENTS

Figure 1:
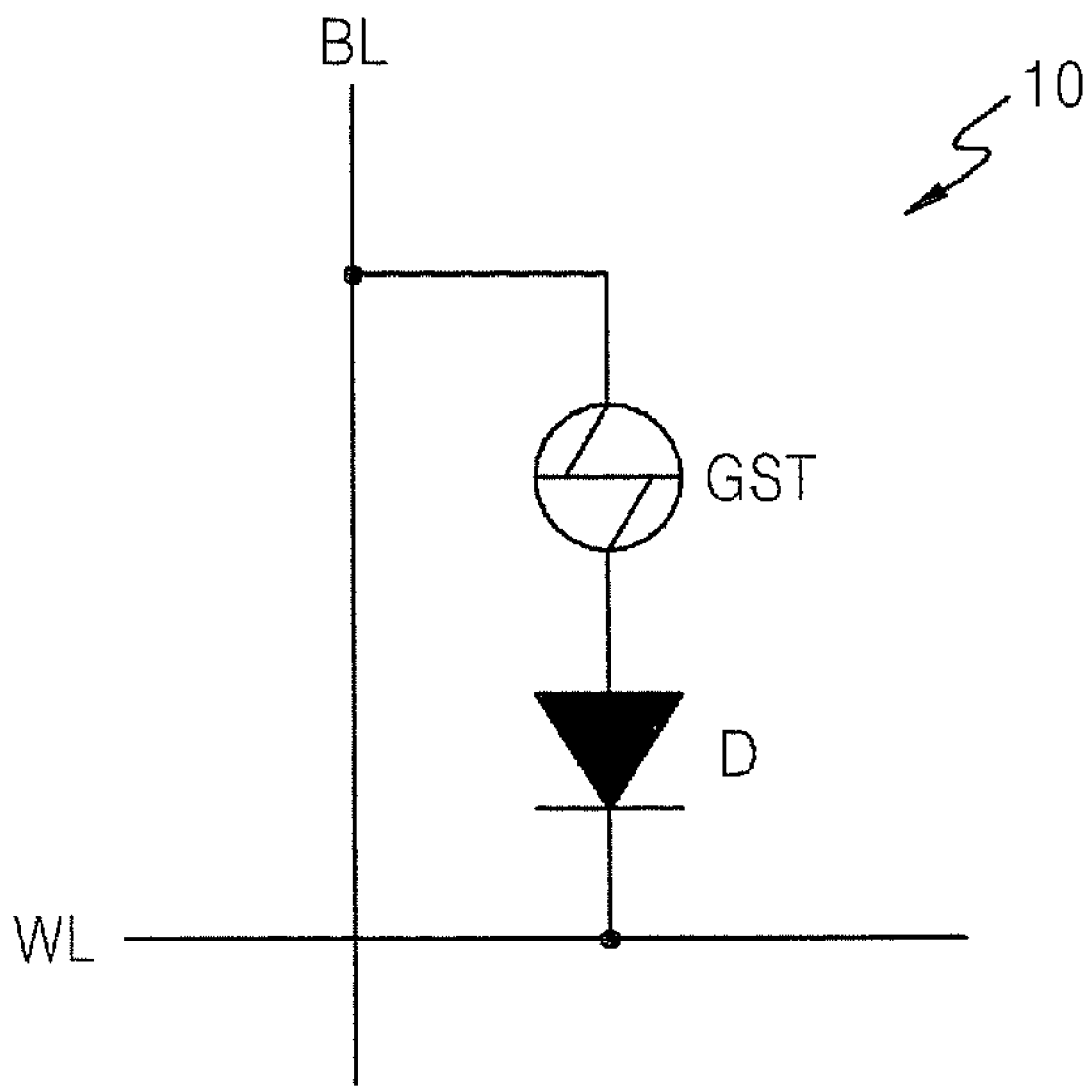
FIG. 1 is an electrical schematic of a conventional diode-type PRAM cell.
Figure 2:
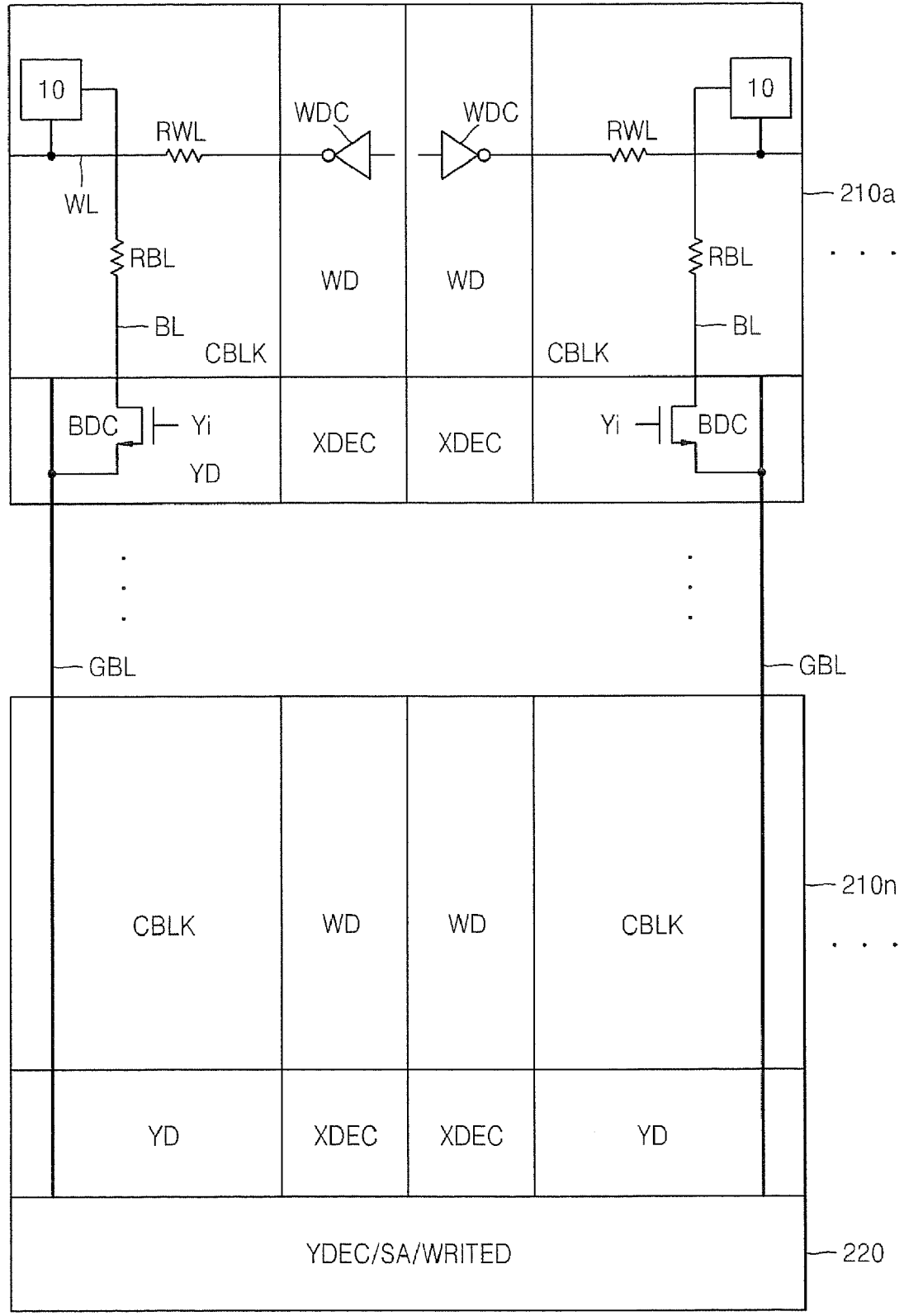
FIG. 2 is an electrical schematic of a conventional memory device having a plurality of PRAM memory blocks therein that are electrically connected to a column decoder/driver circuit.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 3:
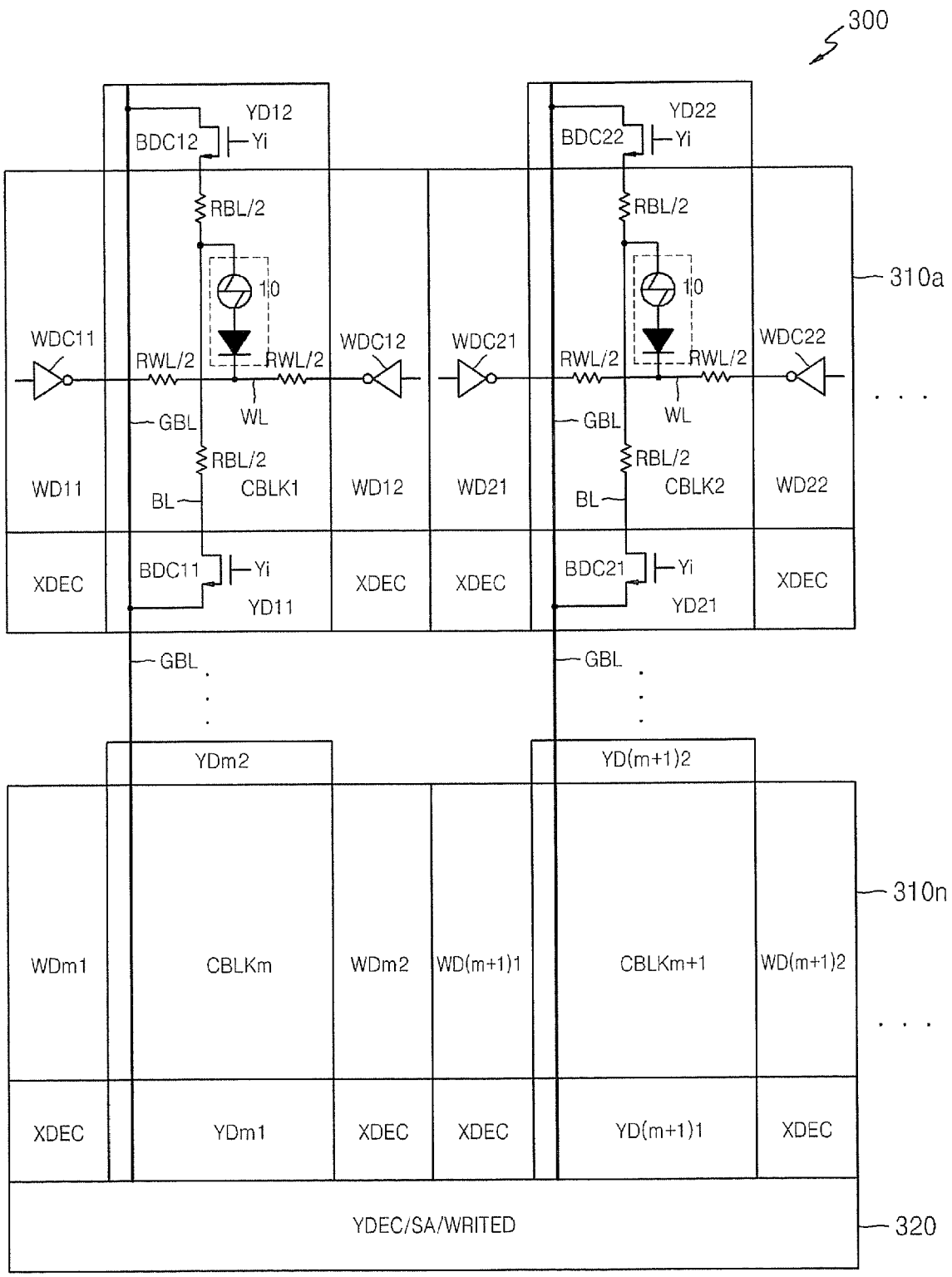
FIG. 3 is an electrical schematic of a multi-block PRAM device according to a first embodiment of the present invention.

Referring now to FIG. 3, a multi-block PRAM device 300 according to a first embodiment of the present invention is illustrated as including a plurality of PRAM memory blocks 310a-310n that are electrically coupled to a column decoder/driver circuit 320. Each of these PRAM memory blocks 310a-310n is illustrated as including a plurality of memory cell blocks ((CBLK1, CBLK2, . . . ) and (CBLKm, CBLK(m+1), . . . )). Each of these memory cell blocks is electrically coupled to a corresponding pair of word line driver circuits (WD), a pair of row decoders (XDEC) and a pair of local bit line selection circuits (YD) therein. In particular, the first memory cell block CBLK1 is electrically coupled in a row direction to a left side word line driver circuit (WD11) and a right side word line driver circuit (WD12). In addition, the first memory cell block CBLK1 is electrically coupled in a column direction to a bottom bit line selection circuit (YD11) and a top bit line selection circuit (YD12). A pair of row decoders XDEC are also provided. These row decoders XDEC generate word line driver signals in response to an applied row address.

The first memory cell block CBLK1 includes a two-dimensional array of PRAM cells 10 containing a plurality of rows and columns. These PRAM cells 10 are illustrated as diode-type PRAM cells, however, transistor-controlled PRAM cells (not shown) may also be used. Each column of PRAM cells 10 is coupled to a corresponding local bit line BL and each row of PRAM cells 10 is coupled to a corresponding word line WL. The resistance of each local bit line BL may equal RBL (½RBL+½RBL) and the resistance of each local word line WL may equal RWL (½RWL+½RWL).

As further illustrated by FIG. 3, each word line is driven by a corresponding pair of word line drivers, which are connected at opposing ends of the respective word line. In particular, the illustrated word line WL is driven by a left side word line driver (WDC11) and a right side word line driver (WDC12). These drivers are illustrated as inverters. Moreover, each local bit line is driven by a corresponding pair of bit line selection devices, which are connected at opposing ends of the respective local bit line. In particular, the illustrated bit line BL is driven by a bottom bit line selection device BDC11 and a top bit line selection device BDC12. These bit line selection devices are illustrated as NMOS transistors having gate terminals responsive to equivalent column selection signals Yi generated within bottom and top bit line selection circuits (YD11, YD12). The drain terminals of the NMOS transistors are connected to a corresponding global bit line GBL, which is controlled by a column decoder/driver circuit 320. The column decoder/driver circuit 320 may be of conventional design.

Similarly, the second memory cell block CBLK2 includes a two-dimensional array of PRAM cells 10 containing a plurality of rows and columns of PRAM cells 10. The second memory cell block CBLK2 is electrically coupled in a row direction to a left side word line driver circuit (WD21) and a right side word line driver circuit (WD22). The second memory cell block CBLK2 is electrically coupled in a column direction to a bottom bit line selection circuit (YD21) and a top bit line selection circuit (YD22). In particular, the illustrated word line WL is driven by a left side word line driver (WDC21) and a right side word line driver (WDC22). The illustrated bit line BL is driven by a bottom bit line selection device BDC21 and a top bit line selection device BDC22. These bit line selection devices are illustrated as NMOS transistors having gate terminals responsive to equivalent column selection signals Yi generated within bottom and top bit line selection circuits (YD21, YD22). The drain terminals of the NMOS transistors are connected to a corresponding global bit line GBL, which is controlled by a column decoder/driver circuit 320. The memory cell blocks CBLKm and CBLK(m+1) within the PRAM memory block 310n are configured in a similar manner to the first and second memory cell blocks CBLK1 and CBLK2.

Referring again to the first memory cell block CBLK1, the bottom bit line selection circuit (YD11) and the top bit line selection circuit (YD12) are configured to electrically connect first and second ends of the local bit line BL to a global bit line GBL during an operation to read data from (or write data to) a selected one of the PRAM memory cells 10 in the corresponding column. This electrical connection is provided by the bottom bit line selection device BDC11 and the top bit line selection device BDC12 when the corresponding column selection signal Yi is switched low-to-high. This dual connection of opposing ends of the local bit line BL to the corresponding global bit line GBL during reading and programming (i.e., writing) operations increases the slew rate of the local bit line signal by reducing the effective resistance of the local bit line BL as seen by the bit line selection devices. This reduction in effective resistance enables the local bit line BL to be longer for a given read/write access time. This ability to support longer local bit lines by using a pair of bit line selection devices on opposing ends of the local bit line enables the use of larger memory cell blocks (e.g., more rows of memory cells).

In a similar manner, the illustrated left side word line driver (WDC11) and a right side word line driver (WDC12) are configured to drive opposing ends of the corresponding local word line WL at the same voltage level during an operation to read data from (or write data to) a selected one of the PRAM memory cells 10 in the row. This dual connection of opposing ends of the local bit line WL during reading and programming (i.e., writing) operations increases the slew rate of the local word line signal and enables the local word line WL to be longer for a given read/write access time. This ability to support longer local word lines by using a pair of word line drivers on opposing ends of the word line enables the use of larger memory cell blocks (e.g., more columns of memory cells).

Figure 4:
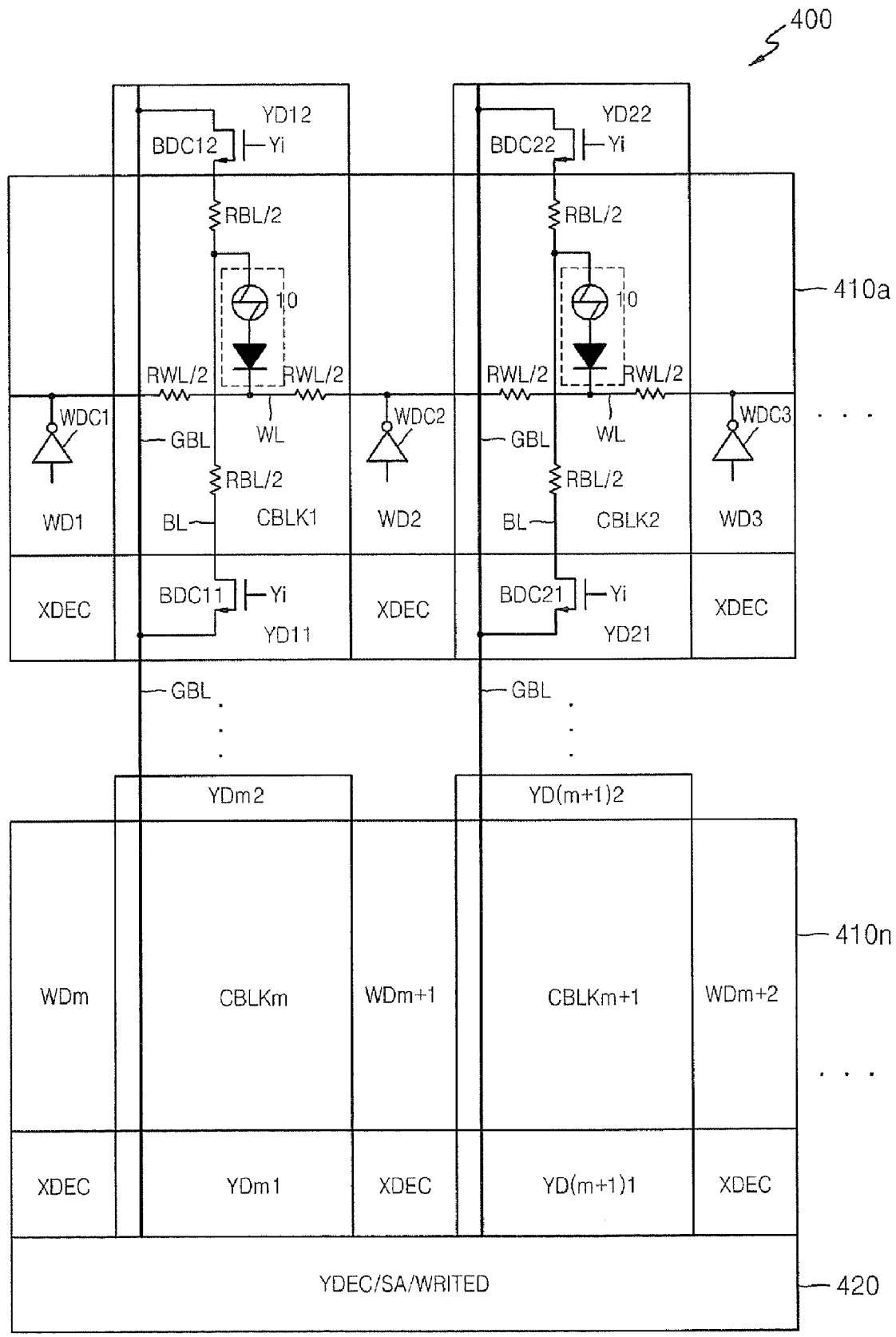
FIG. 4 is an electrical schematic of a multi-block PRAM device according to a second embodiment of the present invention.

Referring now to FIG. 4, a multi-block PRAM device 400 according to a second embodiment of the present invention is illustrated as including a plurality of PRAM memory blocks 410a-410n that are electrically coupled to a column decoder/driver circuit 420. These PRAM memory blocks 410a-410n are essentially identical to the PRAM memory blocks 310a-310n, however, the word line driver circuits WD11, WD12, WD21, WD22, WDm1, WDm2, WD(m+1)1 and WD(M+1)2 illustrated by FIG. 3 are replaced by the following word line driver circuits: WD1, WD2, WD3, WDm, WD(m+1) and WD(m+2). These word line driver circuits include drivers (e.g., WDC1, WDC2, WDC3, . . . ) having outputs connected to intermediate and spaced-apart nodes of a word line that spans multiple memory cell blocks.

Figure 5:
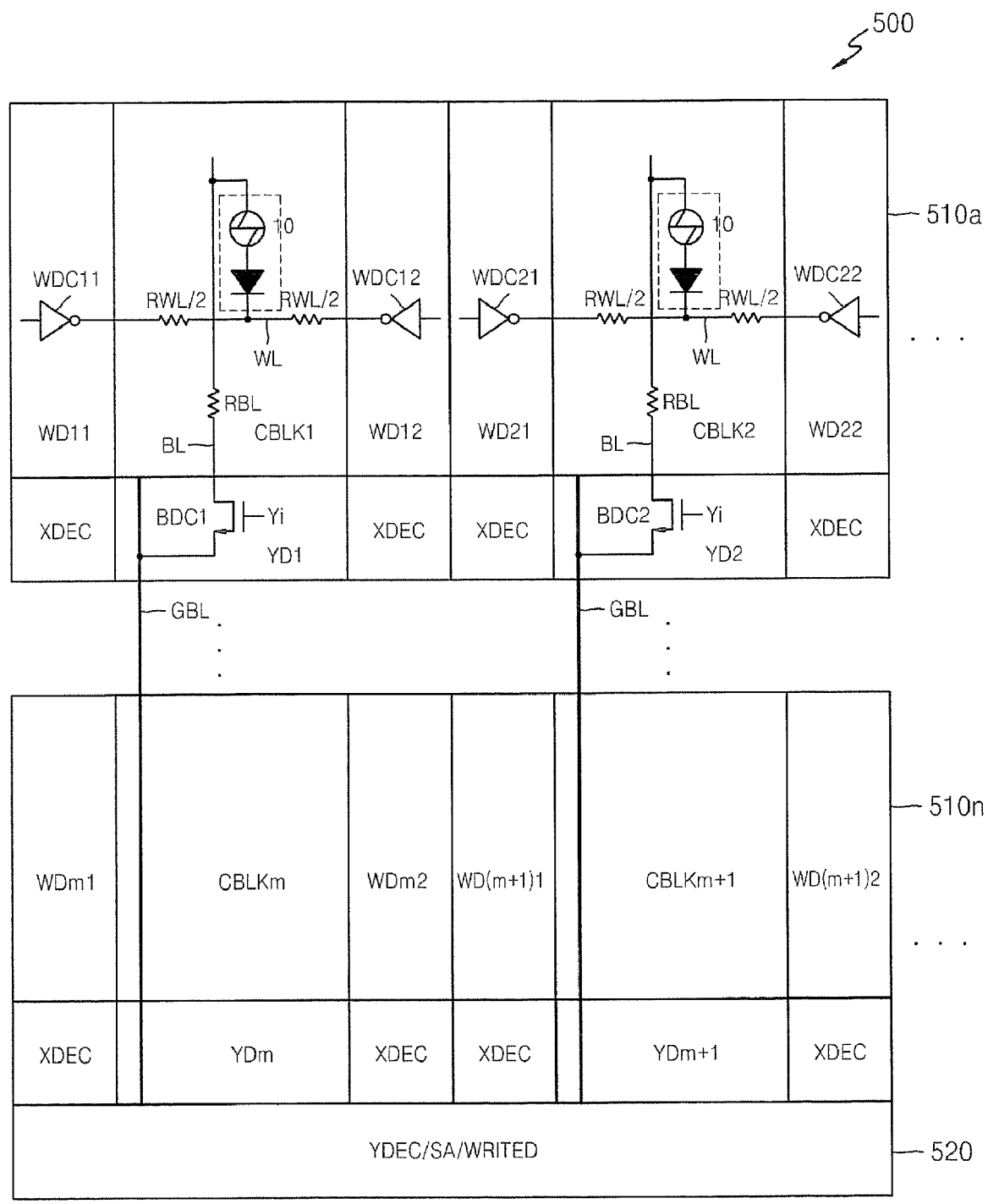
FIG. 5 is an electrical schematic of a multi-block PRAM device according to a third embodiment of the present invention.

Referring now to FIG. 5, a multi-block PRAM device 500 according to a third embodiment of the present invention is illustrated as including a plurality of PRAM memory blocks 510a-510n that are electrically coupled to a column decoder/driver circuit 520. These PRAM memory blocks 510a-510n are similar to the PRAM memory blocks 310a-310n, however, the pairs of bit line selection circuits ((YD11, YD12), (YD21, YD22), . . . ) are replaced by single-sided bit line selection circuits (YD1, YD2, . . . , YDm, YD(m+1) . . . ) containing respective bit line selection devices (e.g., BDC1, BDC2, . . . ).

Figure 6:
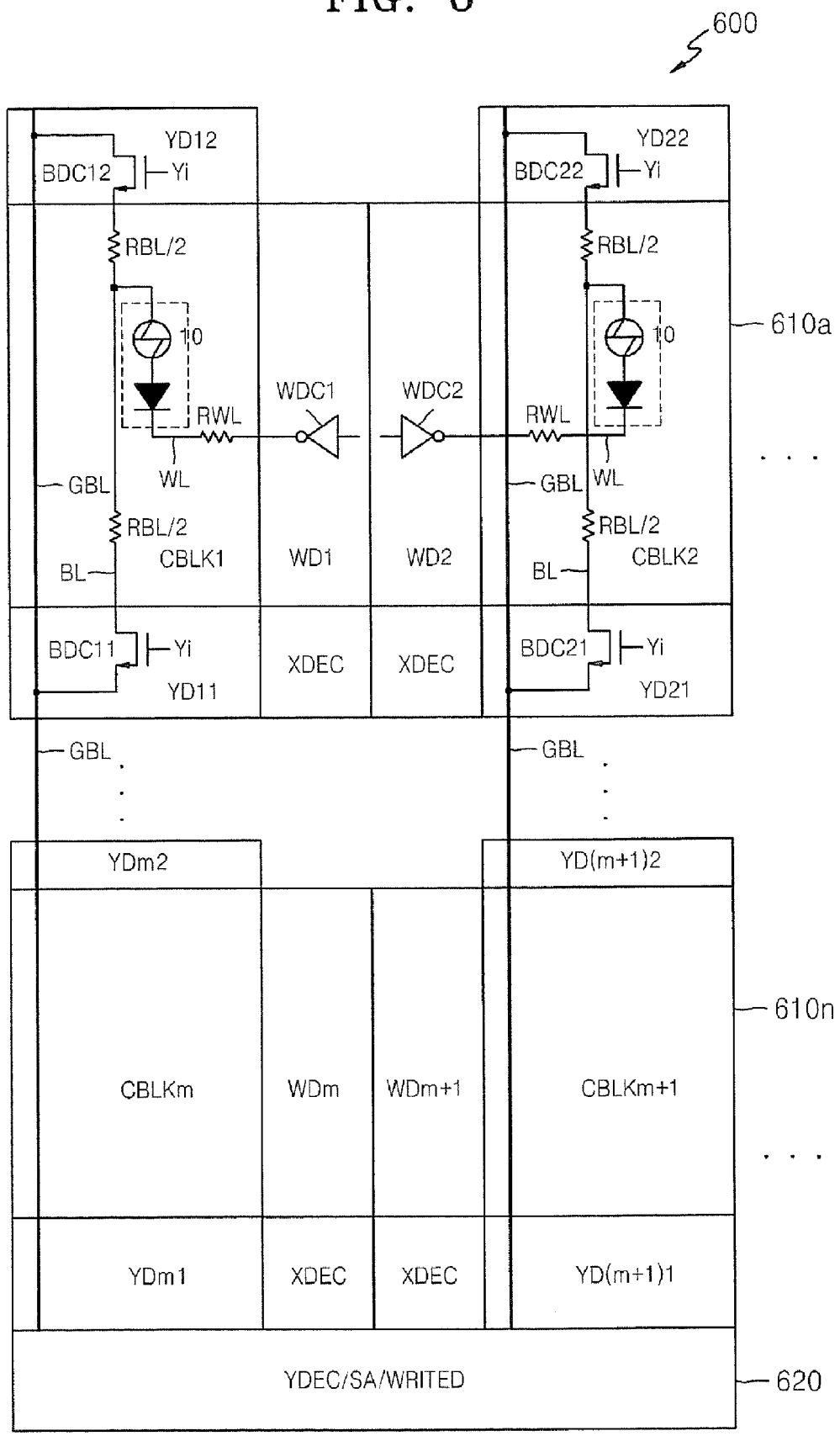
FIG. 6 is an electrical schematic of a multi-block PRAM device according to a fourth embodiment of the present invention.
Figure 7:
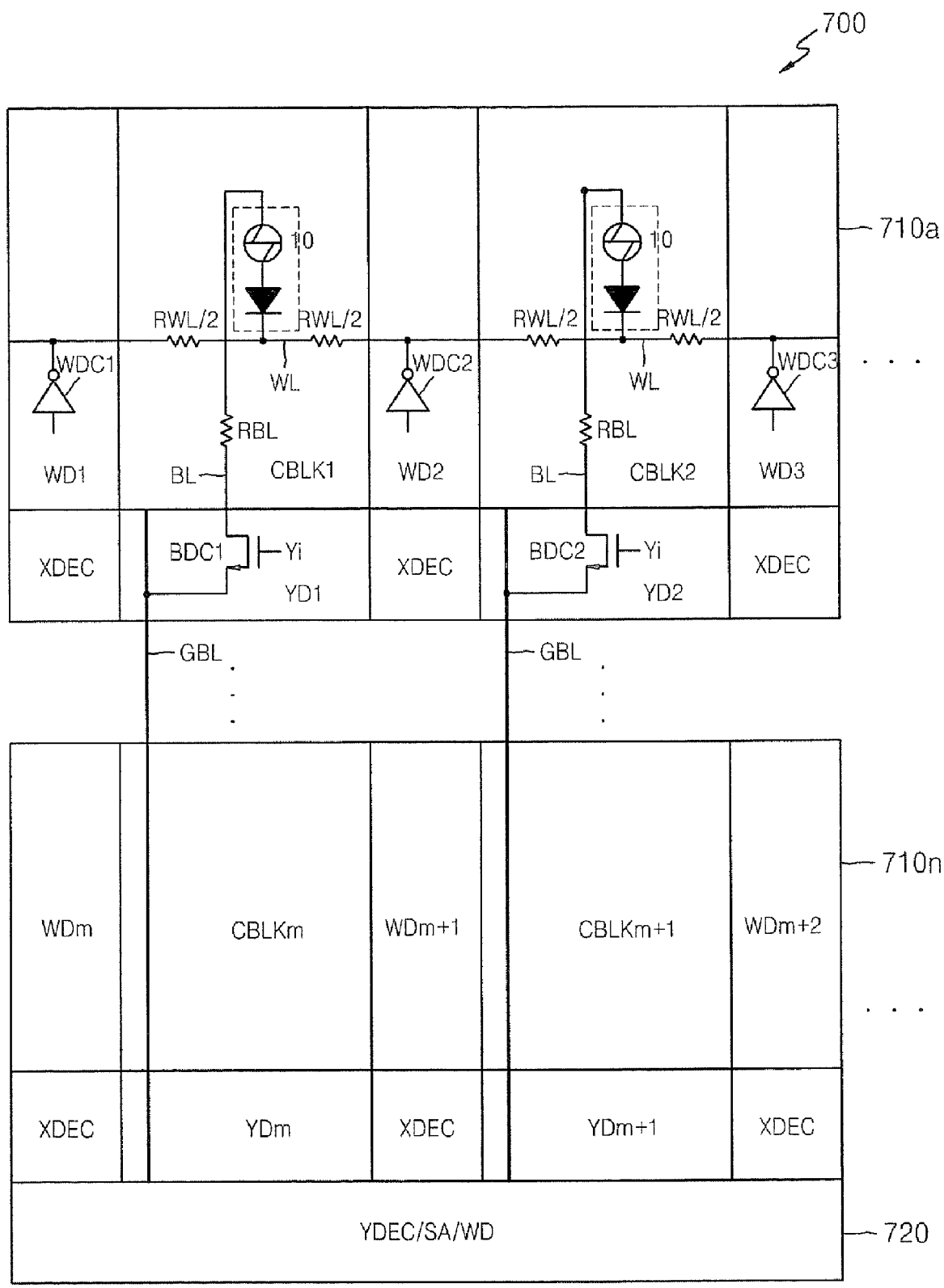
FIG. 7 is an electrical schematic of a multi-block PRAM device according to a fifth embodiment of the present invention.

Referring now to FIG. 6, a multi-block PRAM device 600 according to a fourth embodiment of the present invention is illustrated as including a plurality of PRAM memory blocks 610a-610n that are electrically coupled to a column decoder/driver circuit 620. These PRAM memory blocks 610a-610n are similar to the PRAM memory blocks 310a-310n of FIG. 3, however, the pairs of word line driver circuits (WD11, WD12) and (WD21, WD22) illustrated by FIG. 3 are replaced by single-sided word line driver circuits WD1, WD2, WDm, WD(m+1), . . . having respective word line drivers therein (e.g., WDC1, WDC2, . . . ). Next, as illustrated by FIG. 7, which illustrates a multi-block PRAM device 700 according to a fifth embodiment of the present invention, the plurality of PRAM memory blocks 410a-410n illustrated by FIG. 4 are replaced by PRAM memory blocks 710a-710n, which are electrically coupled to a column decoder/driver circuit 720. The PRAM memory blocks 710a-710n are similar to the PRAM memory blocks 410a-410n, however, the pairs of bit line selection circuits ((YD11, YD12), (YD21, YD22), . . . ) are replaced by single-sided bit line selection circuits (YD1, YD2, . . . ) containing respective bit line selection devices (e.g., BDC1, BDC2, . . . ).

Figure 8A:
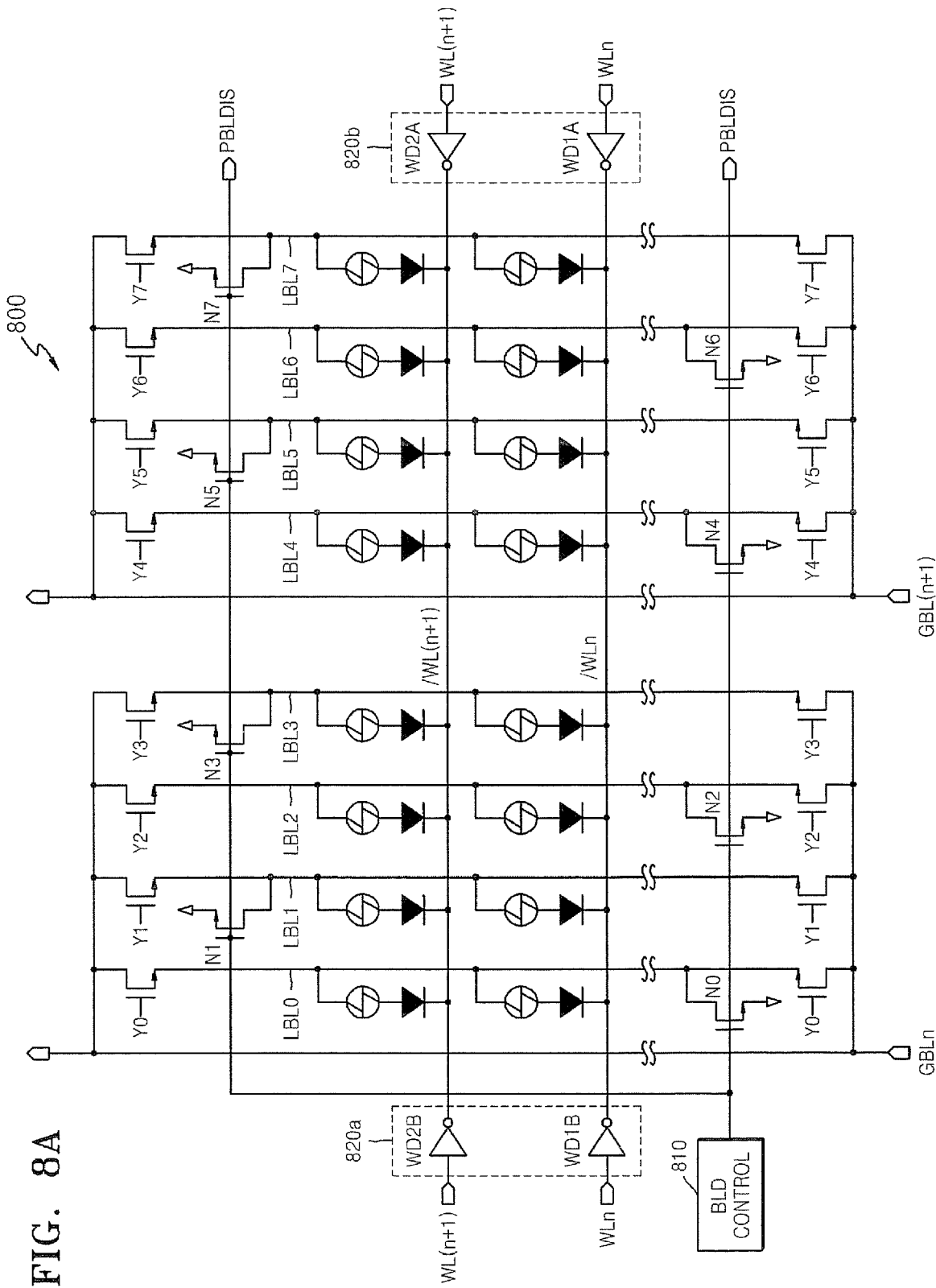
FIG. 8A is an electrical schematic of a non-volatile memory device with a bit line discharge control circuit, according to embodiments of the present invention.

An integrated circuit memory device 800 according to another embodiment of the invention is illustrated by FIG. 8A. In contrast to the memory device 300 of FIG. 3, the memory device 800 includes a bit line discharge (BLD) control circuit 810 that generates a pulsed bit line discharge signal PBLDIS having the timing illustrated by FIG. 8B. This pulsed bit line discharge signal PBLDIS is provided to a plurality of local bit line discharge circuits, which are shown as NMOS pull-down transistors (N0-N7). In particular, the pulsed bit line discharge signal PBLDIS is provided to the gate terminals of the NMOS pull-down transistors N0-N7 so that a low-to-high transition of PBLDIS enables the corresponding local bit lines LBL0-LBL7 to be pulled down to logic 0 voltage levels (e.g., Vss/GND). Thereafter, each high-to-low transition of PBLDIS causes the drain terminals of the NMOS pull-down transistors N0-N7 to be placed in high impedance states and causes each unselected local bit line to be placed in a floating condition. In alternative embodiments of the invention, the plurality of local bit line discharge circuits may utilize PMOS pull-up transistors.

The memory device 800 is also illustrated as including opposing word line driver circuits 820a and 820b, which are responsive to corresponding word line signals WLn and WL(n+1). These word line driver circuits 820a and 820b are illustrated as including discrete drivers (e.g., inverters) WD1B, WD2B, WD1A, WD2A. A memory array within the memory device is illustrated as including a plurality of rows and columns of PRAM cells, which are electrically coupled to corresponding word lines (e.g., /WLn and /WL(n+1)) and local bit lines (LBL0-LBL7). Like the memory device 300 of FIG. 3, the memory device 800 utilizes a plurality of pairs of NMOS transistors as components of bit line selection circuits that are responsive to column selection signals Y0-Y7. These bit line selection circuits are electrically coupled to corresponding global bit lines (e.g., GBLn, GBL(n+1)).

Figure 8B:
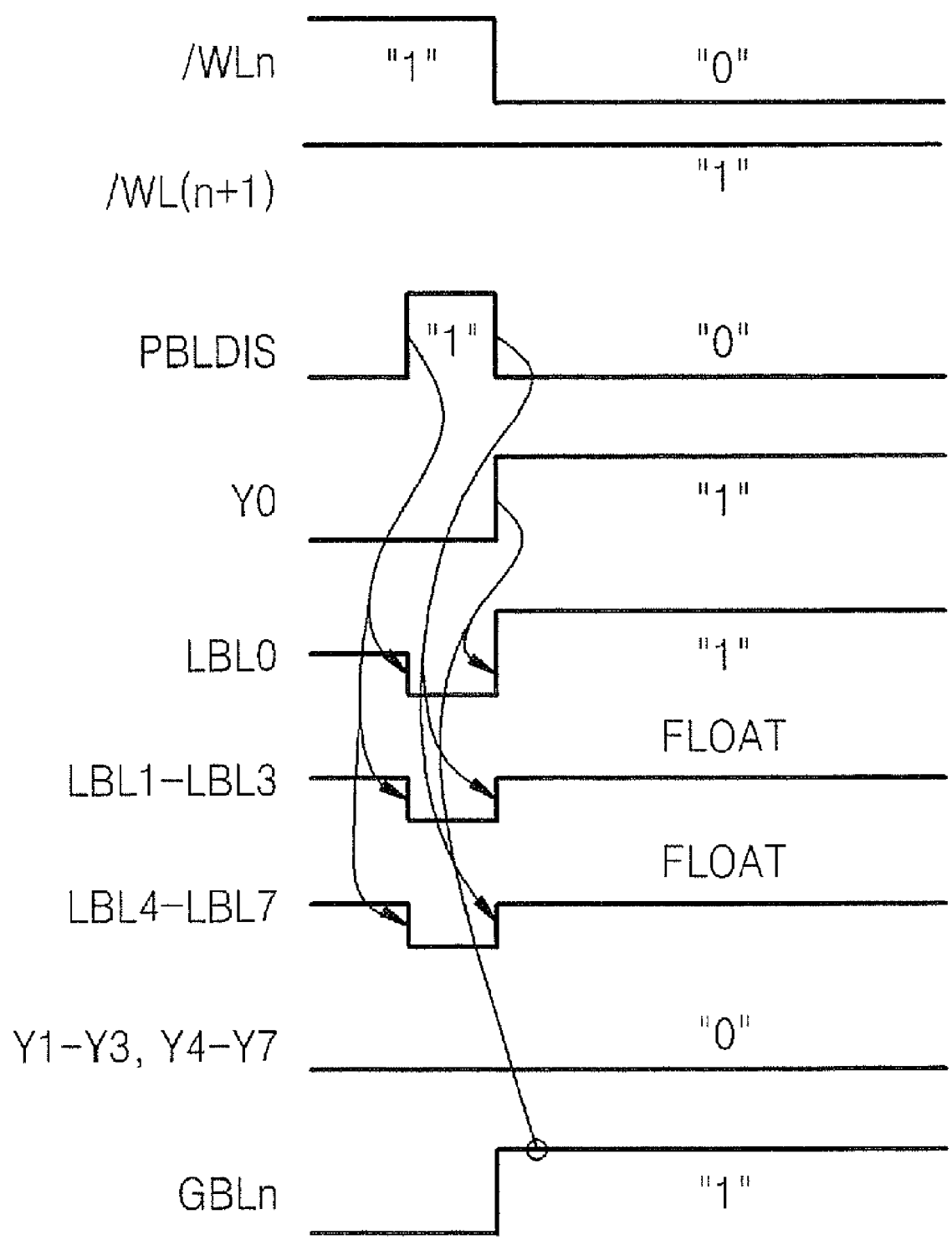
FIG. 8B is a timing diagram that illustrates an operation to read data from a selected memory cell associated with a selected local bit line.

FIG. 8B illustrates an operation to read data from a selected memory cell within the memory array. As will now be described, this selected memory cell is located at an intersection between word line /WLn and local bit line LBL0. The read operation includes an operation to simultaneously discharge the plurality of local bit lines LBL0-LBL7 to logic 0 levels (e.g., Vss) by driving the pulse bit line discharge signal PBLDIS low-to-high to thereby turn-on the NMOS pull-down transistors N0-N7. Thereafter, a selected global bit line GBLn is driven to a logic 1 level and this logic 1 voltage level is passed to a selected local bit line LBL0 by driving a corresponding column selection signal Y0 low-to-high with a logic 1 pulse. In contrast, the unselected local bit lines LBL1-LBL7 are allowed to "float" electrically once the pulse bit line discharge signal PBLDIS switches high-to-low. This passing of the logic 1 voltage level from a global bit line to the selected local bit line LBL0 enables a selected memory cell to be read in-sync with a high-to-low transition of the selected word line /WLn. Thereafter, sequentially driving the column selection signal lines Y1-Y3 with logic 1 pulses (not shown) enables a plurality of memory cells connected to the selected word line /WLn to be read in sequence. Similar operations may also be performed to read data from memory cells associated with the local bit lines LBL4-LBL7.

Accordingly, as described above with respect to FIGS. 8A-8B, a memory device 800 according to an embodiment of the present invention includes a memory array having a plurality of rows and columns of memory cells (e.g., PRAM cells) therein and a first plurality of local bit lines (e.g., LBL0-LBL7) electrically coupled to a corresponding first plurality of columns of memory cells in the memory array. A first plurality of bit line selection circuits are also provided. The first plurality of bit line selection circuits are illustrated as the NMOS transistors that are responsive to the bit line selection signals Y0-Y7. A first plurality of bit line discharge circuits, which are shown as NMOS pull-down transistors N0-N7, are electrically connected to respective ones of the first plurality of local bit lines LBL0-LBL7. A bit line discharge control circuit 810 is provided to drive the first plurality of bit line discharge circuits with equivalent bit line discharge signals (e.g., PBLDIS) during an operation to read data from a selected one of the first plurality of local bit lines LBL0-LBL7.

Figure 9:
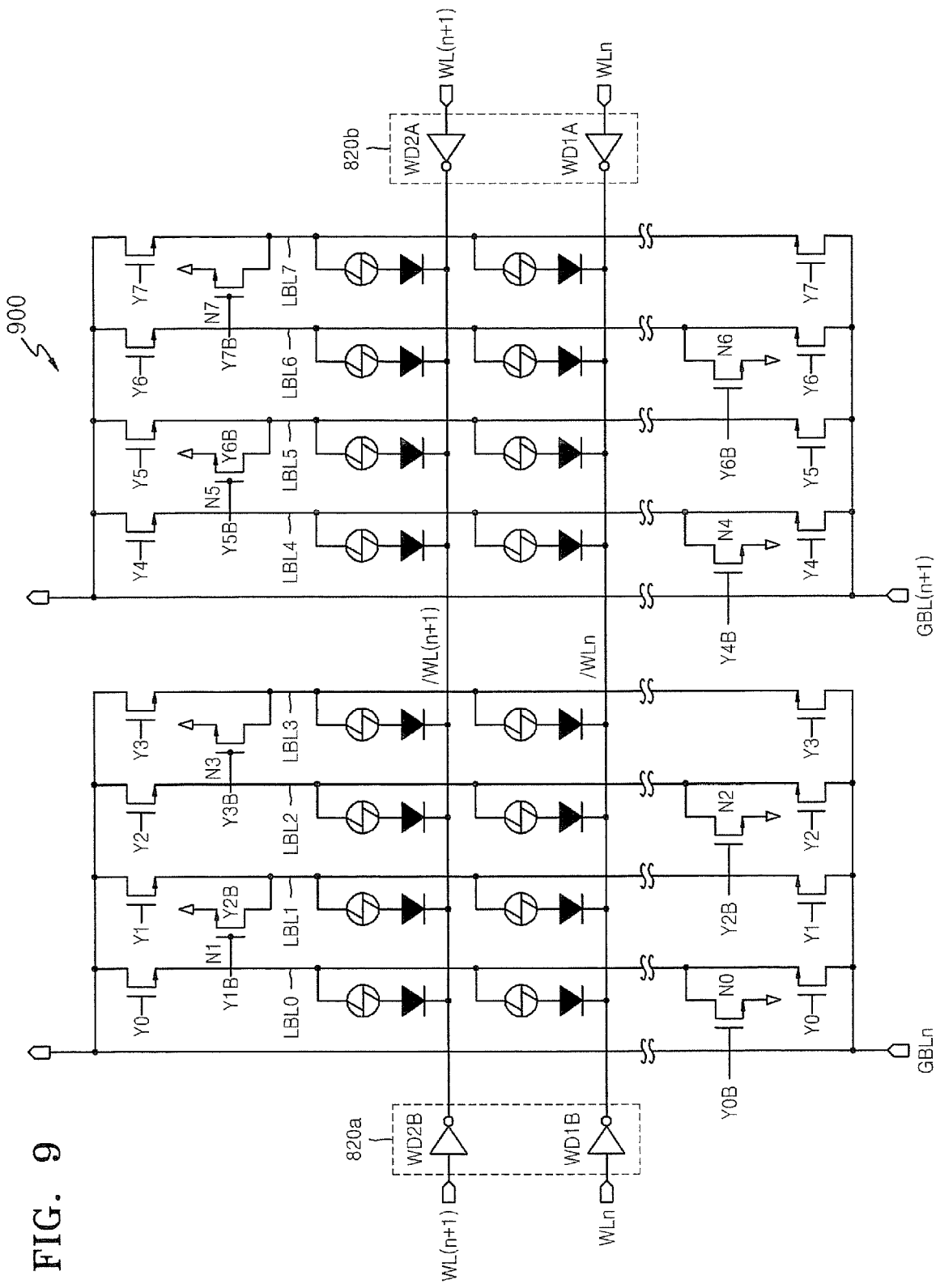
FIG. 9 is an electrical schematic of a non-volatile memory device with local bit line discharge, according to an embodiment of the present invention.

An integrated circuit memory device 900 according to another embodiment of the invention is illustrated by FIG. 9. This memory device 900 is similar to the memory device of FIG. 8A, however, the NMOS pull-down transistors N0-N7 are responsive to distinct bit line discharge signals Y0B-Y7B, which have waveforms that are complementary to the bit line selection signals Y0-Y7. The use of distinct bit line discharge signals Y0B-Y7B precludes any of the local bit lines LBL0-LBL7 from being disposed in a floating condition during a read operation. Instead, each of the local bit lines LBL0-LBL7 is driven from a logic 0 voltage level (not a floating level) to a logic 1 voltage level upon being selected, which may result in an increase in power consumption relative to the memory device 800 of FIG. 8A.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
a memory array having a plurality of rows and columns of memory cells therein;
a first plurality of local bit lines electrically coupled to a corresponding first plurality of columns of memory cells in said memory array;
a first plurality of bit line selection circuits electrically coupled to said first plurality of local bit lines;
a first plurality of bit line discharge circuits electrically connected to respective ones of said first plurality of local bit lines; and
a bit line discharge control circuit configured to drive said first plurality of bit line discharge circuits with equivalent bit line discharge signals during an operation to read data from a selected one of said first plurality of local bit lines.

2. The memory device of claim 1, wherein said first plurality of bit line discharge circuits comprise a first plurality of MOS transistors having first terminals electrically connected to respective ones of said first plurality of local bit lines; and wherein said bit line discharge control circuit is configured to drive gate terminals of said first plurality of MOS transistors at an equivalent voltage during the operation to read data from the selected one of said first plurality of local bit lines.

3. The memory device of claim 2, wherein gate terminals of said first plurality of MOS transistors are electrically connected together.

4. The memory device of claim 1, wherein said first plurality of bit line discharge circuits comprise a first plurality of NMOS pull-down transistors having drain terminals electrically connected to respective ones of said first plurality of local bit lines; and wherein said bit line discharge control circuit is configured to drive gate terminals of said first plurality of NMOS pull-down transistors at an equivalent voltage during the operation to read data from the selected one of said first plurality of local bit lines.

5. The memory device of claim 4, wherein gate terminals of said first plurality of NMOS pull-down transistors are electrically connected together.

6. The memory device of claim 1, wherein the memory cells are non-volatile memory cells.

7. The memory device of claim 6, wherein the memory cells are PRAM cells.

8. A non-volatile memory device, comprising:
a memory array having a plurality of rows and columns of non-volatile memory cells therein;
first and second local bit lines electrically coupled to a corresponding first and second columns of non-volatile memory cells in said memory array;
first and second bit line selection circuits configured to electrically connect first and second portions of said first local bit line, respectively, to a first global bit line during an operation to read data from a selected one of the non-volatile memory cells in the first column of non-volatile memory cells;
third and fourth bit line selection circuits configured to electrically connect first and second portions of said second local bit line, respectively, to the first global bit line during an operation to read data from a selected one of the non-volatile memory cells in the second column of non-volatile memory cells;
first and second bit line discharge circuits electrically connected to said first and second local bit lines, respectively; and
a bit line discharge control circuit configured to drive said first and second bit line discharge circuits with equivalent bit line discharge signals during an operation to read data from a selected one of said first and second local bit lines.

9. The memory device of claim 8, wherein the non-volatile memory cells are PRAM cells.

10. The memory device of claim 8, wherein said first and second bit line selection circuits are responsive to equivalent column selection signals.

11. The memory device of claim 8, wherein said first and second bit line discharge circuits are first and second MOS transistors, respectively; and wherein gate terminals of the first and second MOS transistors are electrically connected together.

12. The memory device of claim 8, wherein said first and second bit line discharge circuits are first and second NMOS transistors, respectively; and wherein gate terminals of the first and second NMOS transistors are electrically connected together.

13. The memory device of claim 8, wherein first and second portions of said first local bit line are opposing ends of said first local bit line.

* * * * *